(12) United States Patent
Shih et al.

(10) Patent No.: US 7,352,245 B2
(45) Date of Patent: Apr. 1, 2008

(54) AUTO-RANGE CURRENT MIRROR CIRCUIT

(75) Inventors: Fu-Yang Shih, Hsinchu (TW); Hsu-Yuan Chin, Hsinchu (TW)

(73) Assignee: Silicon Touch Technology Inc., Hsinchu (TW)

( * ) Notice: Subject to any disclaimer, the term of this patent is extended or adjusted under 35 U.S.C. 154(b) by 76 days.

(21) Appl. No.: 11/477,378

(22) Filed: Jun. 30, 2006

(65) Prior Publication Data

US 2008/0001672 A1  Jan. 3, 2008

(51) Int. Cl.
    *H03F 3/04* (2006.01)
(52) U.S. Cl. ............... 330/288; 330/257; 330/310
(58) Field of Classification Search ........ 330/288, 330/257, 310
    See application file for complete search history.

(56) References Cited

U.S. PATENT DOCUMENTS

| 4,250,461 | A | * | 2/1981 | Limberg | 330/288 |
| 4,523,105 | A | * | 6/1985 | Jose et al. | 327/104 |
| 4,532,467 | A | * | 7/1985 | Mensink et al. | 323/316 |
| 5,504,444 | A | * | 4/1996 | Neugebauer | 327/108 |
| 5,627,732 | A | * | 5/1997 | Loh et al. | 363/16 |
| 6,531,923 | B2 | * | 3/2003 | Burns | 330/296 |
| 7,061,307 | B2 | * | 6/2006 | Iroaga | 327/541 |
| 7,208,998 | B2 | * | 4/2007 | Abel | 327/538 |

* cited by examiner

*Primary Examiner*—Patricia Nguyen
(74) *Attorney, Agent, or Firm*—Bacon & Thomas, PLLC

(57) ABSTRACT

An auto-range current mirror circuit has a current sensing circuit, a front and rear stage current mirrors each has an adjustable amplifying rate. The current sensing circuit presets a threshold current and has an input current of the front stage current mirror. The current sensing current compares the input current with a threshold current and then outputs a controlling signal to the front and rear stage current mirrors to adjust a suitable amplifying rate. Therefore, a bias current of the rear stage current mirror is amplified by the suitable amplifying rate to improve the quality of output current of the rear stage current mirror.

16 Claims, 10 Drawing Sheets

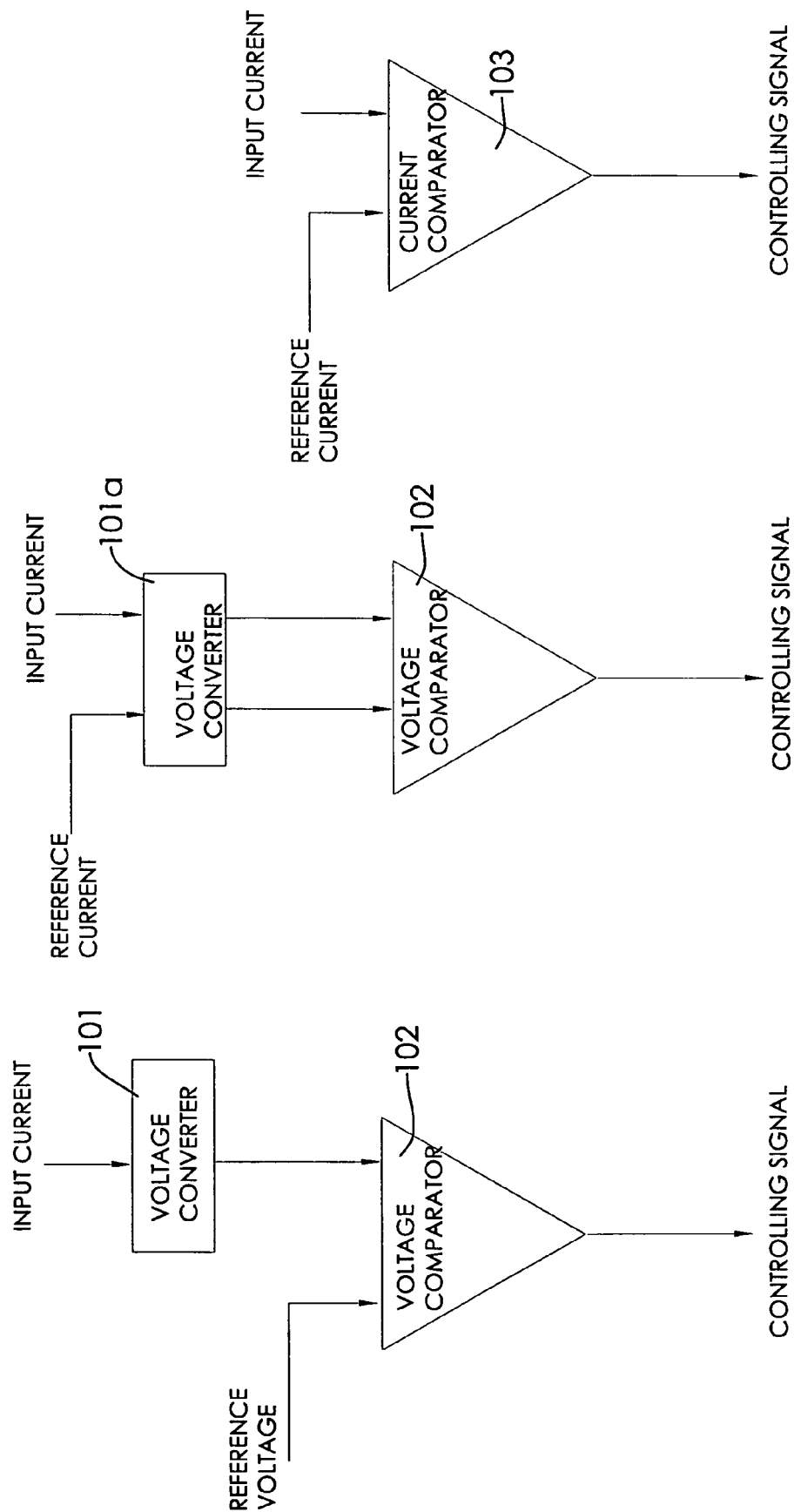

AUTO-RANGE CURRENT MIRROR CIRCUIT

BACKGROUND OF THE INVENTION

1. Field of the Invention

The present invention relates to a current mirror circuit, and more particularly to a current mirror circuit that automatically switches a suitable amplifying rate according to a present input bias current.

2. Description of Related Art

In general, a current mirror is composed of multiple transistor elements. One type of current mirror uses the MOSFETs as the transistor elements. Since the material characteristics of the MOSFETs, supplying different bias currents to the current mirror affects accuracy of the output current of the current mirror.

The MOSFETs applied in the current mirror are mostly operated in the saturation region. The simple relationship between the source current $I_{ds}$ and the gate voltage $V_{gs}$ of the MOSFET is presented $I_{ds}=[\mu C_{OX}(W/L)(V_{gs}-V_{th})^2/2]$ when the MOSFET is operated in the saturation region. The parameters $\mu$, $C_{OX}$, W, L and $V_{th}$ of each MOSFET are determined in fabricating procedure, so the parameters of the MOSFETs of the current mirror are different. Product of $\mu C_{OX}(W/L)$ for each MOSFET of the current mirror is not changed wildly, but value of $(V_{gs}-V_{th})$ is changed when different bias currents are input to the current mirror. That is, the value of $(V_{gs}-V_{th})$ is decreased when a small input bias current is input to the current mirror. Since the material characteristics of the MOSFET, the parameter $V_{th}$ is not stable when the MOSFET is activated for a long time. Therefore, the unstable $V_{th}$ directly affects the source current $I_{ds}$. That is, the lower bias current signal causes the higher error of the output current of the current mirror.

With reference to FIG. 15, a real current mirror circuit device is a two-stage configuration including two current mirrors connected in series. The first stage current mirror is composed of two MOSFETs (M1, M2) and has an amplifying rate being 10:1, an input and an output. The second stage current mirror is composed of the three MOSFETs (M3, M4, M5) and has an amplifying rate being 1:10, an input connected to the output of the first stage current mirror and two outputs.

Assuming an input current ($I_{IN}$) supplied to the input of the first stage current mirror is 100 μA, the bias current ($I_B$) generated in the output of the first stage current mirror is 10 μA according to the amplifying rate (10:1) of the first stage current mirror. The bias current ($I_B$) is supplied to the input of the second stage current mirror and then the second stage current mirror generates two output currents ($I_{OUT1}$, $I_{OUT2}$) (100 μA) in the two outputs according to the amplifying rate (1:10). Furthermore, if the input current ($I_{IN}$) supplying to the input of the first stage current mirror is 10 μA, the bias current ($I_B$) generated in the output of the first stage current mirror is 1 μA. The second stage current mirror then generates two output currents ($I_{OUT1}$, $I_{OUT2}$) (10 μA) in the two outputs. Therefore, the error of the output currents ($I_{OUT1}$, $I_{OUT2}$) increase when a smaller bias current is input to the input of the second stage current mirror.

Regarding to current applications with high accuracy requirement, such as driving circuit of the LED or OLED etc. product, the error of the output current is hard to ignore and is more and more important. Since the driving circuit of the OLED product has to generate multiple small driving currents, the error between the input current of the OLED product and driving currents and skews among driving currents are obviously higher and worse than that of the input current and the driving currents generated by other driving circuit of other product operated in large signal mode. Furthermore, a range of the output current is limited because a maximum bias current is limited according to limitation of the MOSFET standard. If the bias current input to the MOSFET is much lower than the maximum bias current, the error of the output current extremely increases and a large error of the output current limits the improvement for driving circuit having high accuracy requirement.

To overcome the shortcomings, the present invention provides a current mirror circuit that automatically switches a suitable amplifying rate to mitigate or obviate the aforementioned problems.

SUMMARY OF THE INVENTION

The main objective of the invention is to provide a current mirror circuit formed in a multi-stage configuration that automatically switches a suitable amplifying rate according to a present input bias current.

The current mirror circuit has a current sensing circuit, a front and rear stage current mirrors each has an adjustable amplifying rate. The current sensing circuit presets a threshold current and has an input current of the front stage current mirror. The current sensing circuit compares the input current with a threshold current and then outputs a controlling signal to the front and rear stage current mirrors to adjust a suitable amplifying rate. Therefore, a bias current of the rear stage current mirror is amplified by the suitable amplifying rate to improve the quality of output current of the rear stage current mirror.

Other objectives, advantages and novel features of the invention will become more apparent from the following detailed description when taken in conjunction with the accompanying drawings.

BRIEF DESCRIPTION OF THE DRAWINGS

FIG. 2 is a block diagram of a first embodiment of a current sensing circuit in the current mirror circuit in FIG. 1;

FIG. 3 is a block diagram of a second embodiment of a current sensing circuit in the current mirror circuit in FIG. 1;

FIG. 4 is a block diagram of a third embodiment of a current sensing circuit in the current mirror circuit in FIG. 1;

DETAILED DESCRIPTION OF PREFERRED EMBODIMENT

Figure 1:
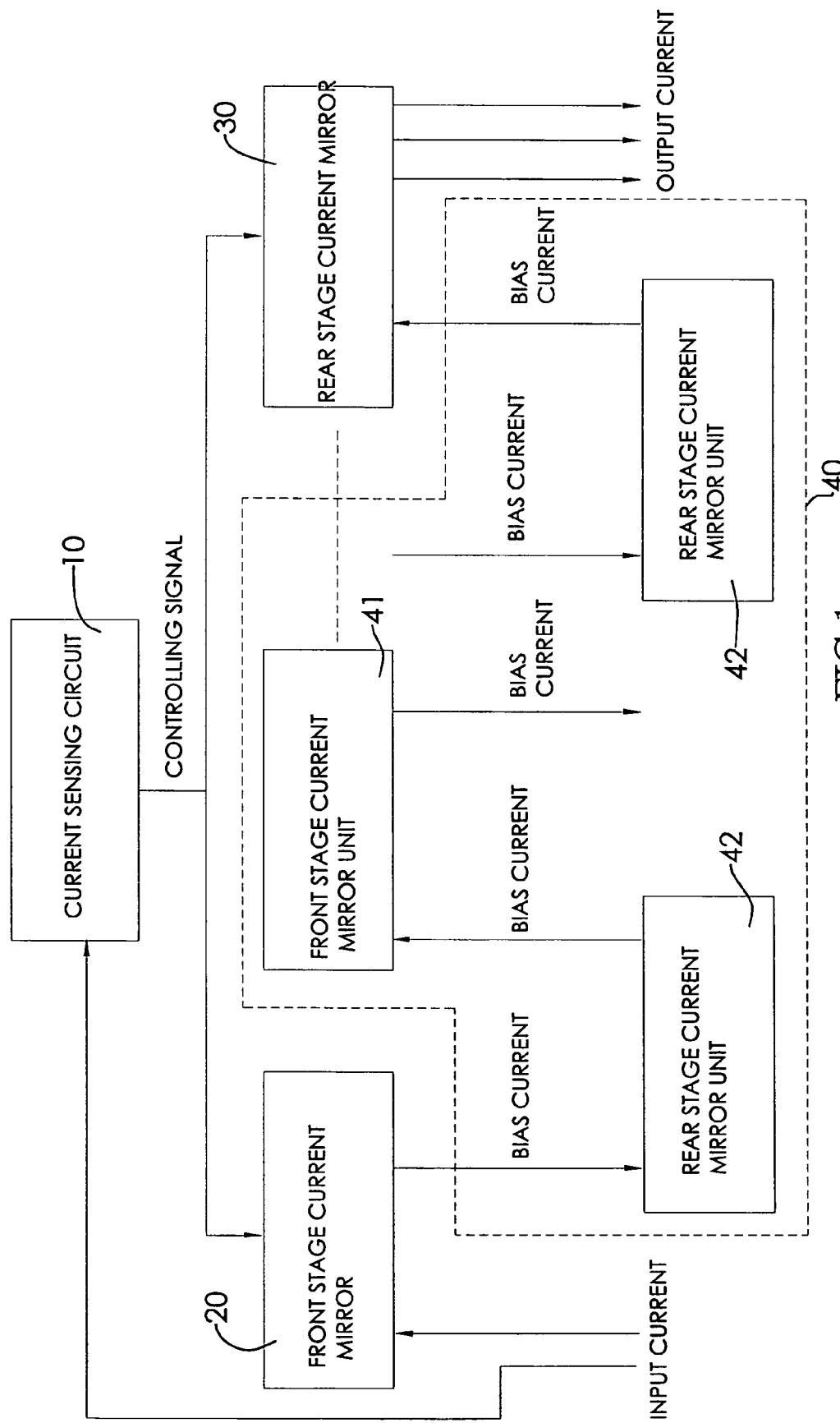
FIG. 1 is a block diagram of a current mirror circuit in accordance with the present invention.

With reference to FIG. 1, an auto-range current mirror circuit in accordance with the present invention comprises a front stage current mirror (20), an optional middle stage current mirror (40), a rear stage current mirror (30) and a current sensing circuit (10).

The front stage current mirror (20) has a first adjustable amplifying rate and is used to generate a bias current according to a present input current. The rear stage current mirror (30) has a second adjustable amplifying rate and can be directly connected to the front stage current mirror (20) in series. The rear stage current mirror (30) is used to provide multiple output currents. In addition, the rear stage current mirror (30) is further connected to the first stage current mirror (20) through at least one middle stage current mirror (40) which can be any type of current mirror. Each middle stage current mirror (40) has at least one front stage current mirror unit (41) and at least one rear stage current mirror unit (42) connected to the corresponding first stage current mirror unit (41). The last front stage current unit (41) is connected to the rear stage current mirror (30) and the first rear stage current mirror unit (42) is connected to the front stage current mirror (20). Furthermore, the middle stage current mirror provides multiple output currents.

Based on the above description of the configuration of the current mirror circuit having the middle stage current mirror, the front stage current mirror (20) can connect to N middle stage current mirrors (40) and each middle stage current mirrors (40) can further connect to M rear stage current mirrors (30). Therefore, the current mirror circuit totally includes N×M rear stage current mirror (30) to provide N×M output currents.

The current sensing circuit (10) is used to detect and determine a magnitude of the input current of the front stage current mirror (20). If the input current is lower than a preset threshold current, the current sensing circuit (10) outputs a controlling signal to the front stage and the rear stage current mirror (20, 30) to simultaneously adjust the amplifying rates thereof. Therefore, the bias current is not amplified by the first amplifying rate of the front stage current mirror (20), but the magnitude of the output current still remains constant.

The current sensing circuit (10) has many different preferred embodiments and three of them are described as follows. With reference to FIG. 2, a first embodiment of the current sensing circuit (10) includes a voltage converter (101) and a voltage comparator (102).

The voltage converter (101) has an input terminal and an output terminal. The input current is supplied to the input terminal of the voltage converter (101) and the voltage converter converts the input current to a corresponding input voltage.

The voltage comparator (102) has two inputs and one output. One of the inputs is connected to the output terminal of the voltage converter (101) and another input is connected to a reference voltage. The voltage comparator (102) compares the input voltage and the reference voltage to determine an output voltage. The output voltage of the voltage comparator (102) is used as the controlling signal.

With further reference to FIG. 3, a second embodiment of the current sensing circuit (10) is similar to the first embodiment and includes a voltage converter (101a) and the voltage comparator (102). The voltage converter (101a) converts the input current and reference current to a corresponding input voltage and a corresponding reference voltage and has two input terminals and two output terminals. The two input terminals are respectively connected to the input current and a reference current, and the two output terminals are connected to the voltage comparator (102). The voltage comparator (102) compares the input voltage and reference voltage to determine an output voltage used as the controlling signal.

With further reference to FIG. 4, a third embodiment of the current sensing circuit (10) includes a current comparator (103). The current comparator (103) directly receives the input current and a reference current and then compares the two currents to output a result as the controlling signal.

Furthermore, the front and the rear current mirrors (20, 30) can be many types of current mirrors, such as analog current mirrors or digital current mirrors.

With reference to FIGS. 5-11, the front or rear stage current mirror (20, 30) can be composed of MOS transistors and may include a basic two-transistor current source, at least one additional transistor and at least one switch. The basic two-transistor current source has an input and an output, a first transistor, a second transistor. The input is connected to the input current. Each transistor has a source, a drain and a gate terminal. The drain and gate terminals of the first transistor are connected to the input. The gate terminals of the first and second transistors are connected to each other. The drain terminal of the second transistor is connected to the output. The source terminals of the first and second transistors are connected to each other. Suitable amplifying rates of the front and the rear current mirrors (20, 30) are adjusted by controlling the ON/OFF statuses of each MOS transistor.

Figure 5:
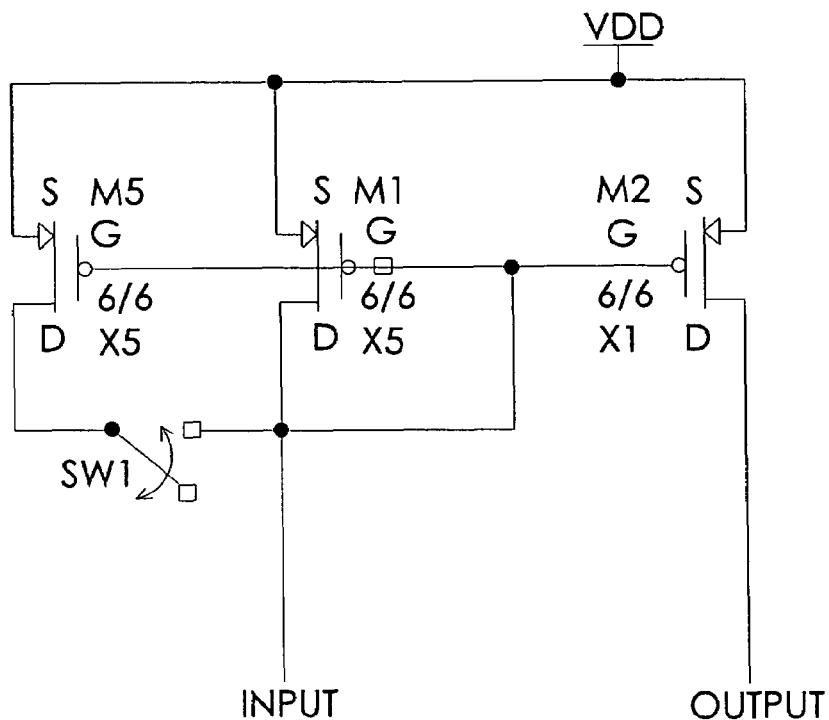
FIG. 5 is a circuit diagram of a first embodiment of a current mirror with adjustable amplifying rate in the current mirror circuit in FIG. 1.

With first reference to FIG. 5, a first embodiment of the front or rear current mirror (20, 30) includes a basic two-transistor (M1, M2) current source, an additional transistor (M5) and a switch (SW1).

The additional transistor (M5) has a source terminal, a drain terminal and a gate terminal. The additional transistor (M5) is connected to the first transistor (M1) of the basic two-transistor current source in parallel. The gate, source and drain terminals of the additional transistor (M5) are connected to the gate, source and drain terminals of the first transistor (M1). The switch (SW1) is connected between the two drain terminals of the additional and the first transistors (M5, M1). Therefore, controlling the ON/OFF statuses of the switch (SW1) determines whether or not the additional transistor (M5) is connected to the basic two-transistor (M1, M2) current source. Ratios of width to length (hereinafter W/L) of the first and additional transistors (M1, M5) are the same and are larger than the width to length of the second transistor (M2). For example, the W/L of the additional or first transistor (M1) can be $W_1:L_1$ and the W/L of the second transistor can be $W_2:L_2$, wherein $W_1>W_2$ and $L_1>L_2$.

Figure 6:
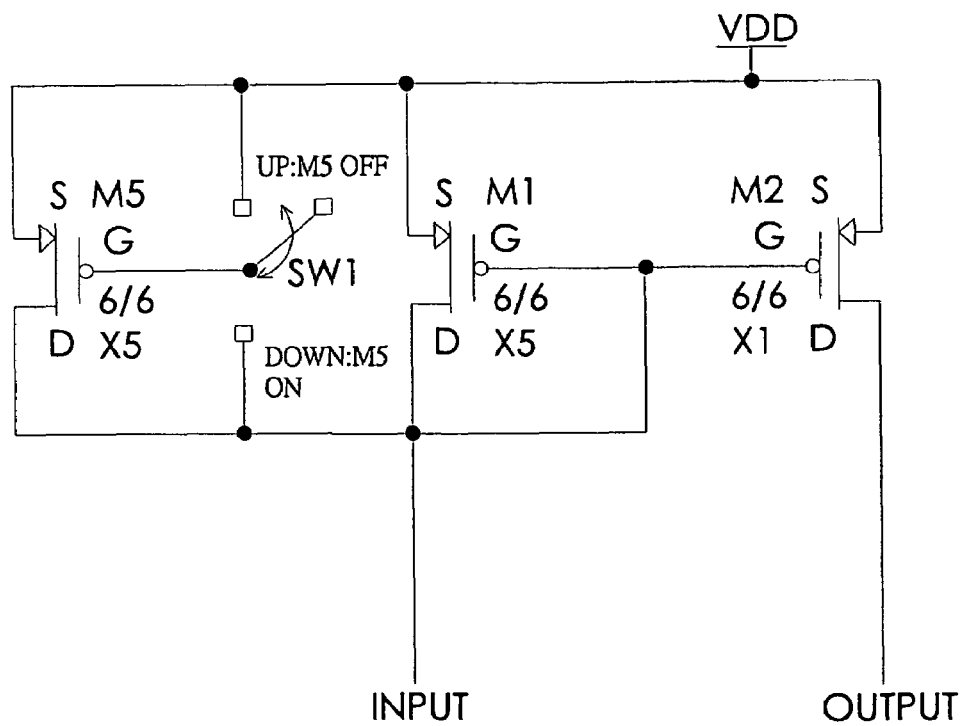
FIG. 6 is a circuit diagram of a second embodiment of a current mirror with adjustable amplifying rate in the current mirror circuit in FIG. 1.

With reference to FIG. 6, a second embodiment of the current mirror has the same elements of the first embodiment in FIG. 5. However, the switch (SW1) is connected to the gate, source and drain terminals of the additional transistor (M5) and the gate terminal of the additional transistor (M5) is not connected to the gate terminal of the first transistor (M1).

Figure 7:
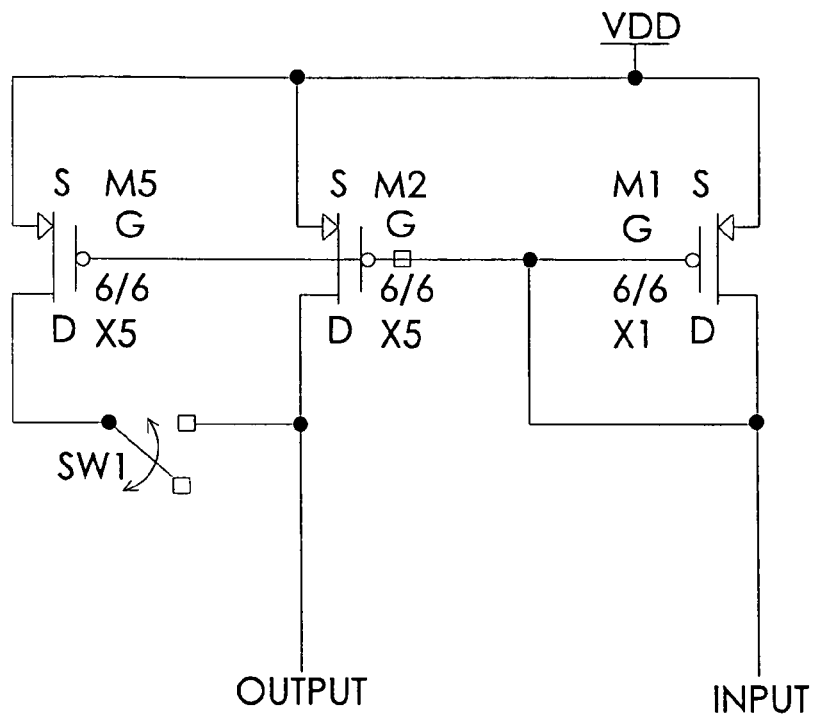
FIG. 7 is a circuit diagram of a third embodiment of a current mirror with adjustable amplifying rate in the current mirror circuit in FIG. 1.
Figure 8:
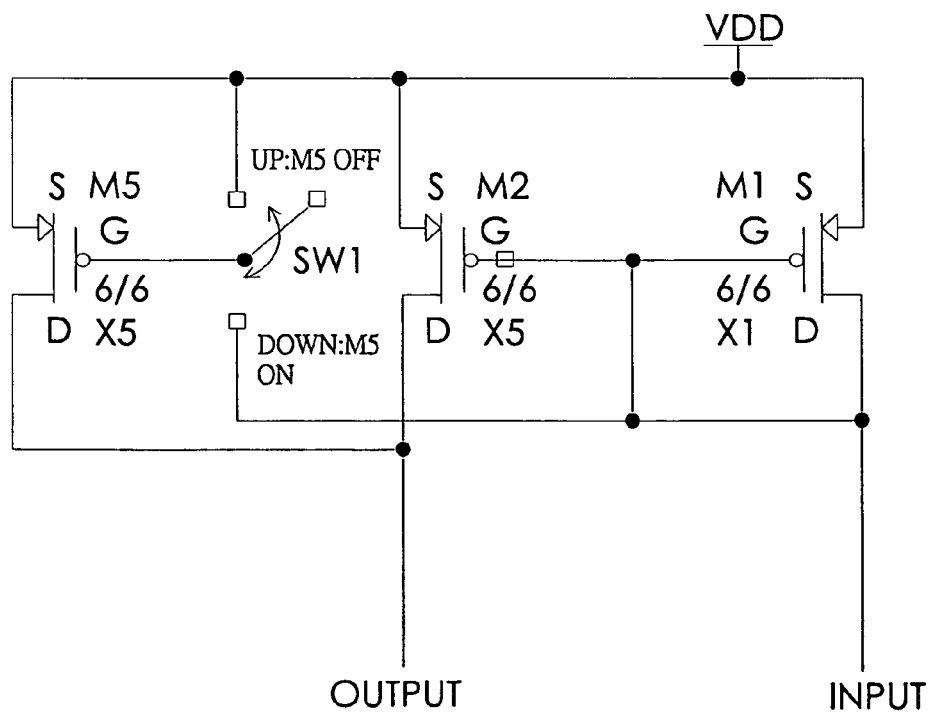
FIG. 8 is a circuit diagram of a fourth embodiment of a current mirror with adjustable amplifying rate in the current mirror circuit in FIG. 1.

With reference to FIG. 7, a third embodiment of the current mirror is similar to the first embodiment in FIG. 5. The differences between the first and third embodiments are that the additional transistor (M5) is connected to the second transistor (M2) in parallel and rations of a width and a length of the second and additional transistors (M2, M5) are the same and larger than that of the first transistor (M1). With reference to FIG. 8, a fourth embodiment of the current mirror is similar to the second embodiment in FIG. 6. The additional transistor (M5) is connected to the second transistor (M2) in parallel, and rations of a width and a length of the second and additional transistors (M2, M5) are the same and larger than that of the first transistor (M1).

Figure 9:
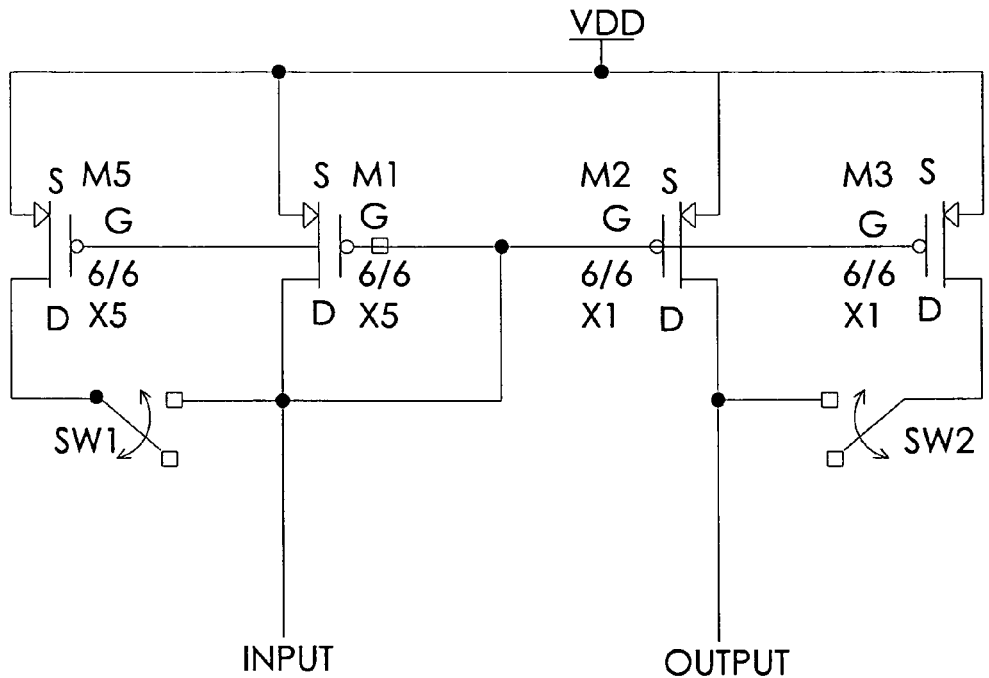
FIG. 9 is a circuit diagram of a fifth embodiment of a current mirror with adjustable amplifying rate in the current mirror circuit in FIG. 1.

With reference to FIG. 9, a fifth embodiment of the current mirror has the basic two-transistor (M1, M2) current source comprising a first transistor (M1) and a second transistor (M2), two additional transistors (M3, M5) and two switches (SW1, SW2). The two additional transistors (M3, M5) are respectively connected to the first and second transistors (M1, M2) in parallel. One of the switches (SW1) is connected between the drain terminals of one of the additional transistor (M5) and the drain terminal of the first transistor (M1), and the other switch (SW2) is connected between the drain terminals of the other additional transistor (M3) and the drain terminal of the second transistor (M2).

Figure 10:
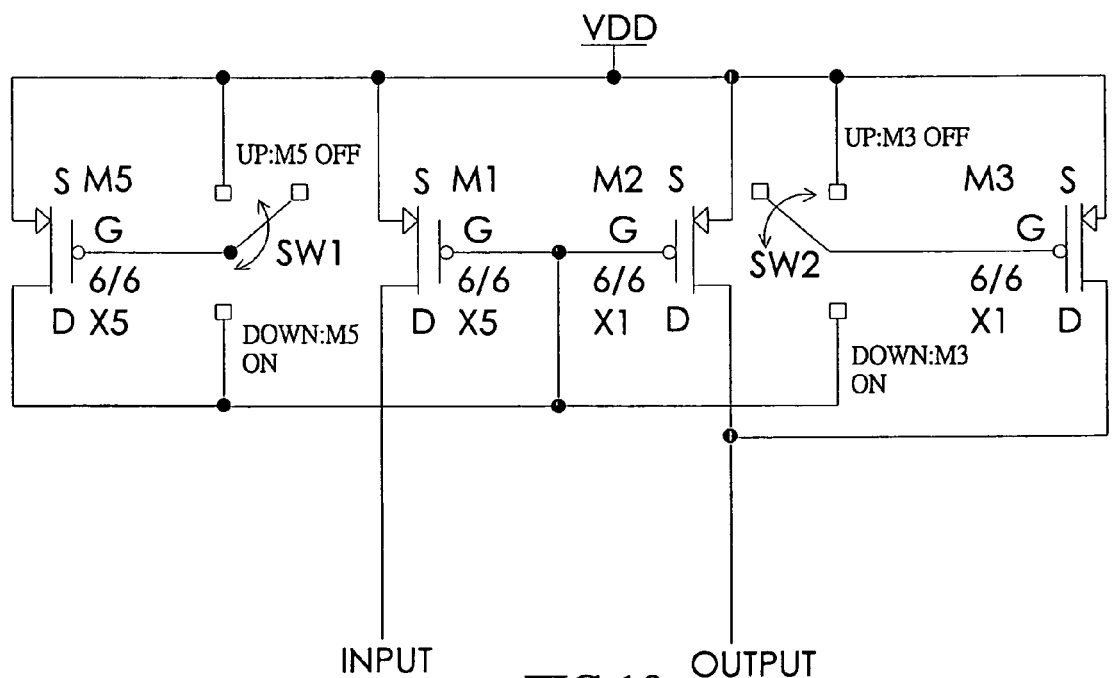
FIG. 10 is a circuit diagram of a sixth embodiment of a current mirror with adjustable amplifying rate in the current mirror circuit in FIG. 1.

With reference to FIG. 10, a sixth embodiment of the current mirror is similar to the fifth embodiment of the current mirror, but the gate terminals of the two additional transistors (M5, M3) are not connected to the gate terminals of the first and second transistors (M1, M2). One switch (SW1) is connected to the drain and source terminals of one of the additional transistor (M5) and the other switch (SW2) is connected to the drain and source terminals of the other additional transistor (M3).

Figure 11:
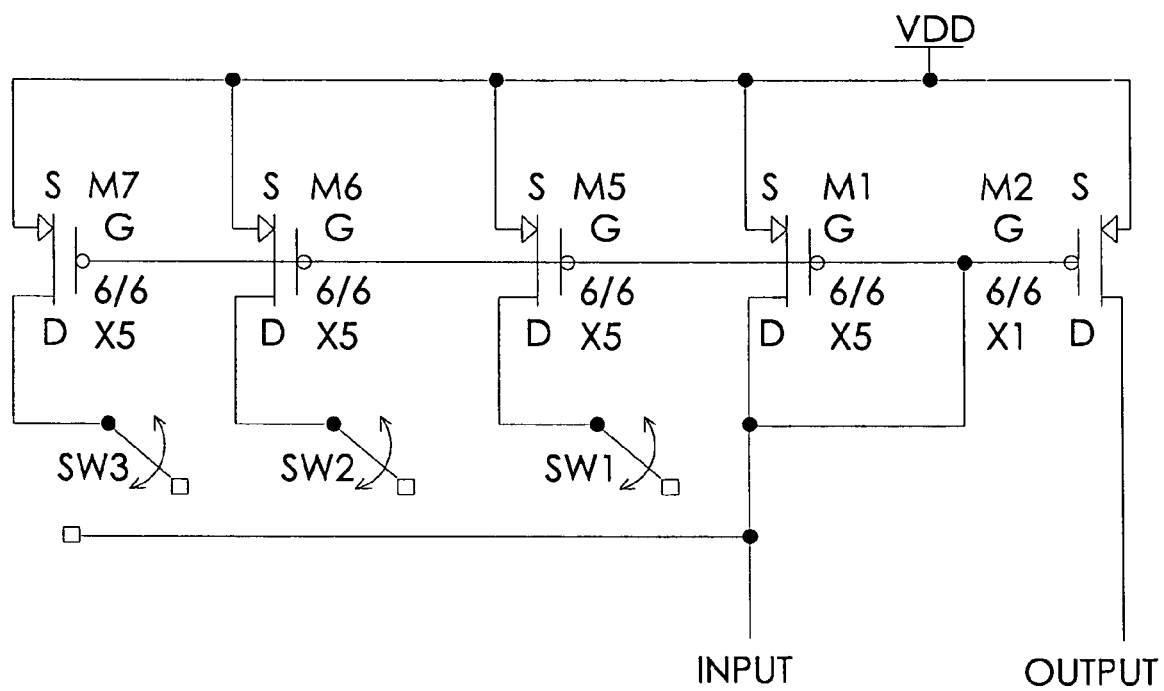
FIG. 11 is a circuit diagram of a seventh embodiment of a current mirror with adjustable amplifying rate in the current mirror circuit in FIG. 1.

With reference to FIG. 11, a seventh embodiment of the current mirror has the basic two-transistor (M1, M2) current source and three additional transistors (M5, M6, M7) and three switches (SW1, SW2, SW3). The three additional transistors (M5, M6, M7) are connected to the first transistor (M1). The switches (SW1, SW2, SW3) are respectively connected between the drain terminals of the additional transistors (M5, M6, M7) and the drain terminal of the first transistor (M1).

In general, to control ON/OFF statuses of each additional transistor, it is better to supply different voltages to the gate or drain terminal of the additional transistor. However, if the amplifying rates of the first and second transistors are required to adjust at the same, other terminals of the additional transistor can be considered to change voltage level, too. The above embodiments of the current mirror can be applied to other configurations of the current mirror, such as Cascode Current mirror. In addition, switches can be used NMOS, PMOS or combination of NMOS and PMOS.

Figure 12:
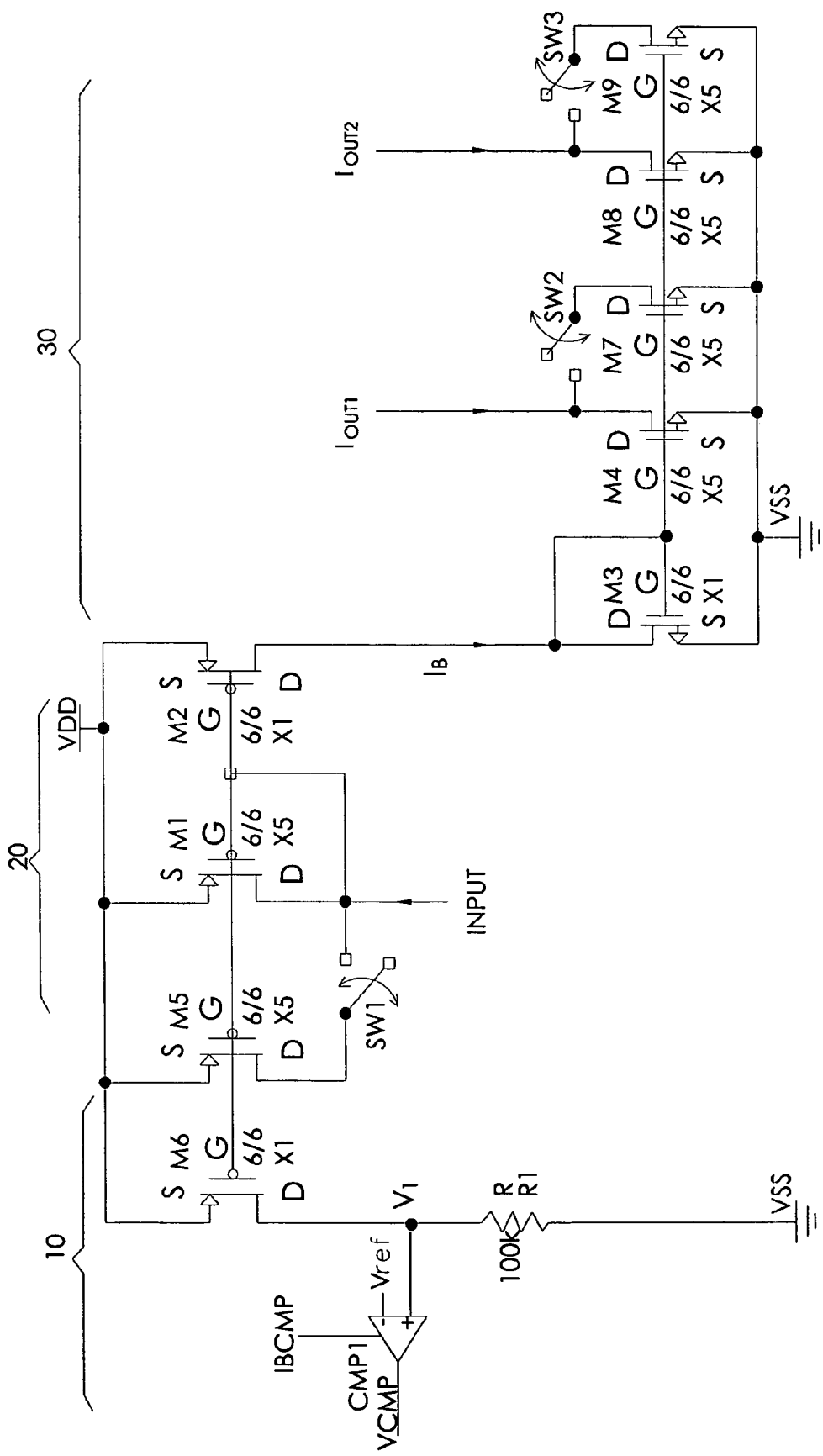
FIG. 12 is a circuit diagram of a first embodiment of a current mirror circuit in accordance with the present invention.

With reference to FIG. 12, a first embodiment of the current mirror circuit in accordance with the present invention includes a front stage and a rear stage current mirrors (20, 30) connected in series and a current sensing circuit (10) connected to the front stage current mirror (20). The current mirror circuit of this embodiment automatically adjusts the suitable amplifying rates of the front stage and the rear stage current mirrors (20, 30) to generate a constant output current and reduce error of the output current.

The current sensing circuit has a voltage converter and a voltage comparator (CMP1). In this embodiment, the voltage converter has a MOS transistor (M6) and a resistor (R1). The resistor (R1) is connected to the MOS transistor (M6) in series. The input of the voltage comparator (CMP1) is connected to a reference voltage (Vref), and the other input is connected to a node between the MOS transistor (M6) and the resistor (R1) to obtain an input voltage (V1) dropped on the resistor (R1).

The front stage current mirror (20) uses the first embodiment in FIG. 5 and has two amplifying rates. The MOS transistor (M5) of the front stage current mirror (20) is connected to the additional transistor (M6). The ON/OFF statuses of the switch (SW1) are controlled by the current sensing circuit (10). The front stage current mirror (20) firstly determines whether the switch (SW1) is in ON or OFF status to adjust a suitable amplifying rate according the output voltage of the voltage comparator (CMP1). Then, the front stage current mirror (20) outputs a bias current ($I_B$) according to the present amplifying rate.

In this embodiment, the rear stage current mirror (30) has the basic two-transistor (M3, M4) current source, first/second/third additional transistors (M7, M8, M9) and two switches (SW2, SW3) controlled by the current sensing circuit (10). The two transistors (M3, M4) current source has a first transistor (M3) and a second transistor (M4). The three additional transistors (M7, M8, M9) are connected to the second transistor (M4) of the basic two-transistor (M3, M4) current source in parallel. The drain terminal of the first additional transistor (M7) is connected to the drain terminal of the second transistor (M4) through one switch (SW2). The drain terminal of the third additional transistor (M9) is connected to the drain terminal of the second additional transistor (M8) through another switch (SW3). Therefore, the rear stage current mirror (30) generates two output currents ($I_{OUT1}$, $I_{OUT2}$) according to the bias current ($I_B$) with the present amplifying rate.

A partial current supplied to the current sensing circuit (10) is the same as the input current ($I_{IN}$) into the resistor R1, since a corresponding voltage (V1) dropped on the resistor (R1). The comparator (CMP1) compares the reference voltage (Vref) with the voltage (V1) dropped on the resistor (R1). The result of comparison between the reference voltage (Vref) and the voltage (V1) dropped on the resistor (R1) is used to control the ON or OFF status of the switches (SW1, SW2, SW3).

When the input current ($I_{IN}$) is lower than a threshold current, the switches (SW1, SW2, SW3) are controlled to be in OFF status to adjust the amplifying rates of the front stage and the rear stage current mirror (20, 30). The bias current ($I_B$) is amplified but the output currents ($I_{OUT1}$, $I_{OUT2}$) both keep in constant. In order to increase the accuracy of the output current, the current sensing circuit (10) has to operate before the front stage and the rear stage current mirror (20, 30) are operated. To save power, the current sensing circuit (10) may be shut down to keep stabilization of the current mirror circuit after the current sensing circuit (10) outputs a controlling signal. If the current mirror circuit is applied in other system circuit having unstable power problem, the current sensing circuit (10) does not be shunt down.

The front stage and the rear stage current mirror (20, 30) are used to adjust the bias current ($I_B$). However, different bias current ($I_B$) does not affect the values of the output currents ($I_{OUT1}$, $I_{OUT2}$).

For example, assuming the present amplifying rates of the front stage and the rear stage current mirrors (20, 30) are respectively 10:1 and 1:10, and the threshold current is 50 μA. If the input current ($I_{IN}$) is larger than the threshold current to be 100 μA, the bias current ($I_B$) is 10 μA and the original output currents ($I_{OUT1}$, $I_{OUT2}$) are both 100 μA. If the input current ($I_{IN}$) is lower than the threshold current to be 10 μA, the three switches (SW1, SW2, SW3) are switched in OFF status. Thereby the present amplifying rates of the front stage current mirror (20) and the rear stage current mirror (30) are automatically adjusted to 5:1 and 1:5 and then the bias current ($I_B$) is 2 μA. Therefore, the output currents ($I_{OUT1}$, $I_{OUT2}$) both become 10 μA.

If the amplifying rates of the front stage current mirror (20) and the rear stage current mirror (30) are not adjusted to 5:1 and 1:5, the bias current ($I_B$) will be only 1 μA. However, the bias current ($I_B$) is twice higher than that of the front and rear stage current mirrors (20, 30) with switches (SW1, SW2, SW3) in OFF status. Therefore, the higher bias current ($I_B$) causes the lower error of the output current.

Figure 13:
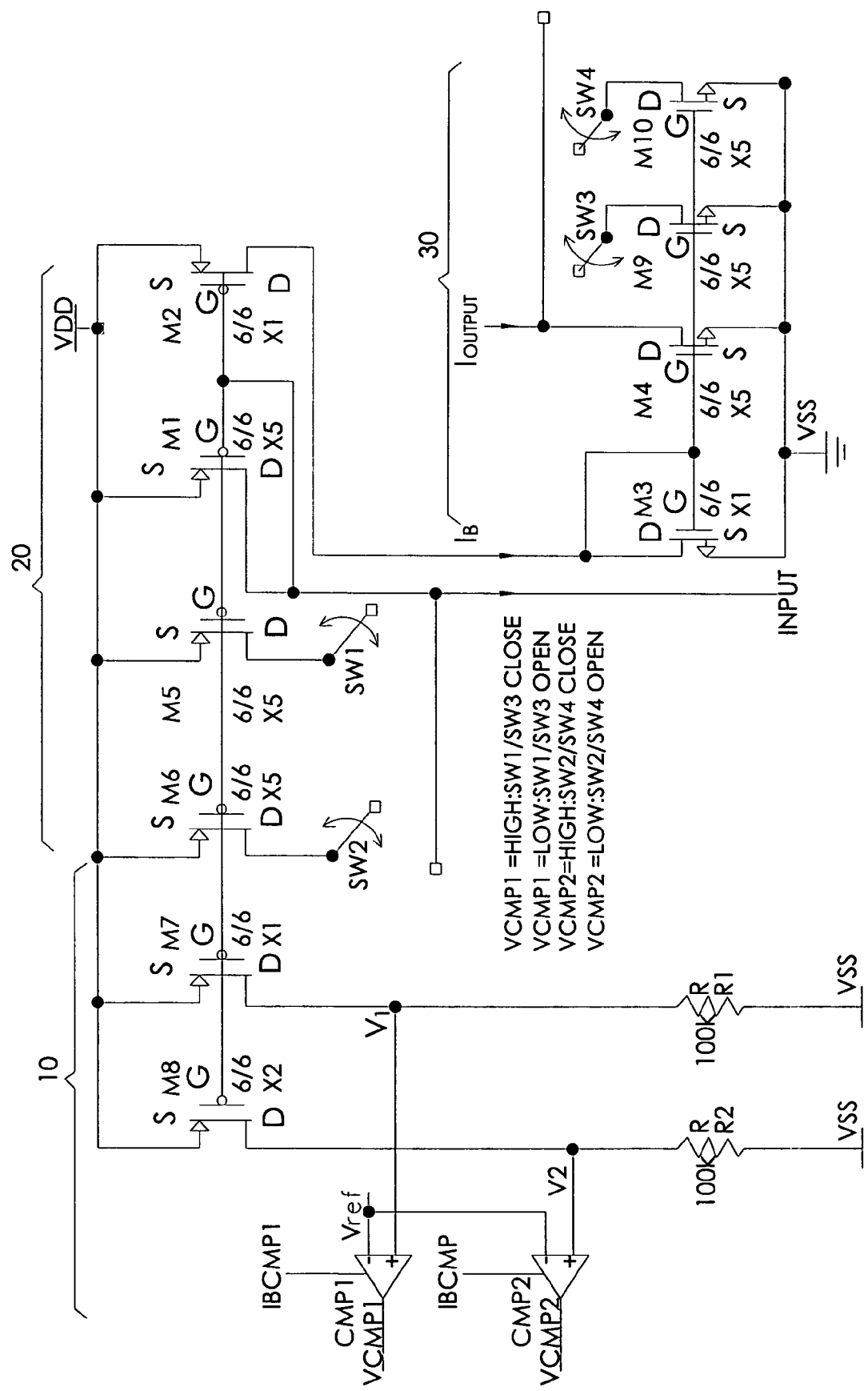
FIG. 13 is a circuit diagram of a second embodiment of a current mirror circuit in accordance with the present invention.

To increase the accuracy of the output current, the current mirror circuit further has multiple different threshold currents to compare the present input current. With further reference to FIG. 13, a second embodiment of the current mirror circuit in accordance with the present invention with multiple threshold currents further uses two current sensing circuits (10) to have two threshold currents. Each current sensing circuit (10) is same as that of the first embodiment in FIG. 12.

In this embodiment, the front stage current mirror (20) has a basic two-transistor (M1, M2) current source and two additional transistors (M5, M6). The two additional transistors (M5, M6) are respectively connected to the first transistor (M1) of the basic two-transistor (M1, M2) current source in parallel through two switches (SW1, SW2).

The rear stage current mirror (30) has a basic two-transistor current (M3, M4) source and two additional transistors (M9, M10). The two additional transistors (M9, M10) are connected to the second transistor (M4) of the basic current (M3, M4) source through two switches (SW3, SW4).

If the current sensing circuit (10) uses two transistors (M7, M8) that have different W/L and are connected to the input current, there are two threshold currents are preset. Thus, the current mirror circuit of this embodiment has three amplifying rates.

When a partial current of the input current ($I_{IN}$) flows through the two resistors (R1, R2) of the current sensing circuit (10), two different voltages (V1, V2) are respectively dropped on the two resistors (R1, R2). The two comparators (CMP1, CMP2) of the current sensing circuit (10) respectively compare the corresponding voltages V1 and V2 with a common reference voltage (Vref). The results (Vcmp1, Vcmp2) of comparison between the voltages (V1, V2) and the reference voltage (Vref) are respectively used to control ON/OFF statuses of the switches (SW1, SW3) of the front stage current mirror (20) and (SW2, SW4) of the rear stage current mirrors (30). When the input current ($I_{IN}$) is lower than the lower threshold current, the four switches (SW1 to SW4) remain OFF. When the input current ($I_{IN}$) is lower than the higher threshold current but higher than the lower threshold current, the switches (SW1, SW3) are switched to be in ON status and the switches (SW2, SW4) still remains in OFF status. When the input current ($I_{IN}$) is higher than the higher threshold current, the switches (SW2, SW4) are further switched to ON. Thereby the bias current ($I_B$) is amplified and the output current ($I_{OUT}$) keeps in constant. That is, multiple threshold currents can improve the accuracy of the output current and increase the adjustable range of the output current ($I_{OUT}$) but not affect the output current ($I_{OUT}$).

Furthermore, in order to increase the accuracy of the output currents, the current sensing circuits (10) have to be operated before the front stage and the rear stage current mirror (20, 30) are operated. After the current sensing circuits (10) finish comparing the input current ($I_{IN}$) with the threshold currents, the current sensing circuits may be shut down to save energy and avoid the switches (SW1 to SW4) switched frequently.

In the second embodiment of the current mirror circuit, the current sensing circuits (10) use two transistors (M7, M8) with different W/L to have two threshold currents. However, this is not the only way to have two threshold currents. For example, the two current sensing circuits (10) can use two transistors with the same W/L but use two different resistors. Thereby the two voltages (V1, V2) dropped on the corresponding two resistors (R1, R2) are different. Besides, the two current sensing circuits (10) can have two transistors with the same W/L, the same resistors (R1, R2) and different voltage comparators (CMP1, CMP2) to have two threshold currents.

Figure 14:
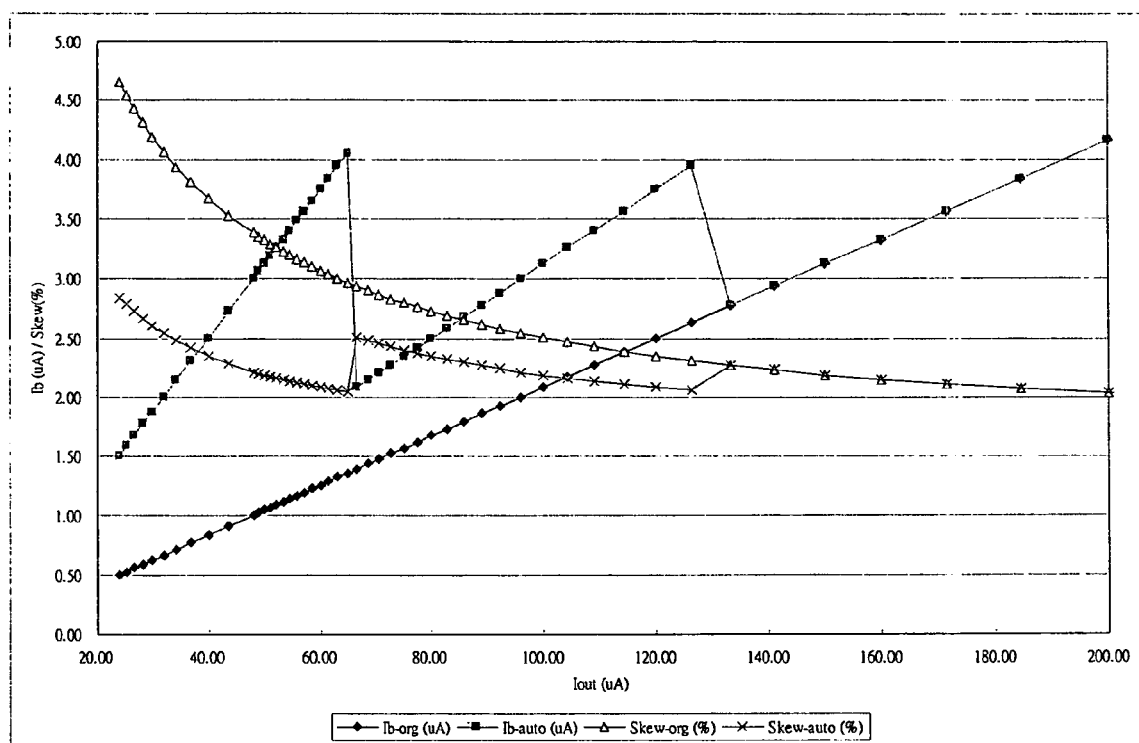
FIG. 14 is graph of the two relationships, one of them is represented an output current ($I_{OUT}$) and a bias current ($I_B$)/current skew of the output current of a current mirror circuit in accordance with the present invention, and the other is represented an output current ($I_{OUT}$) and a bias current ($I_B$)/current skew of the output current of a conventional current mirror in accordance with the prior art.
Figure 15:
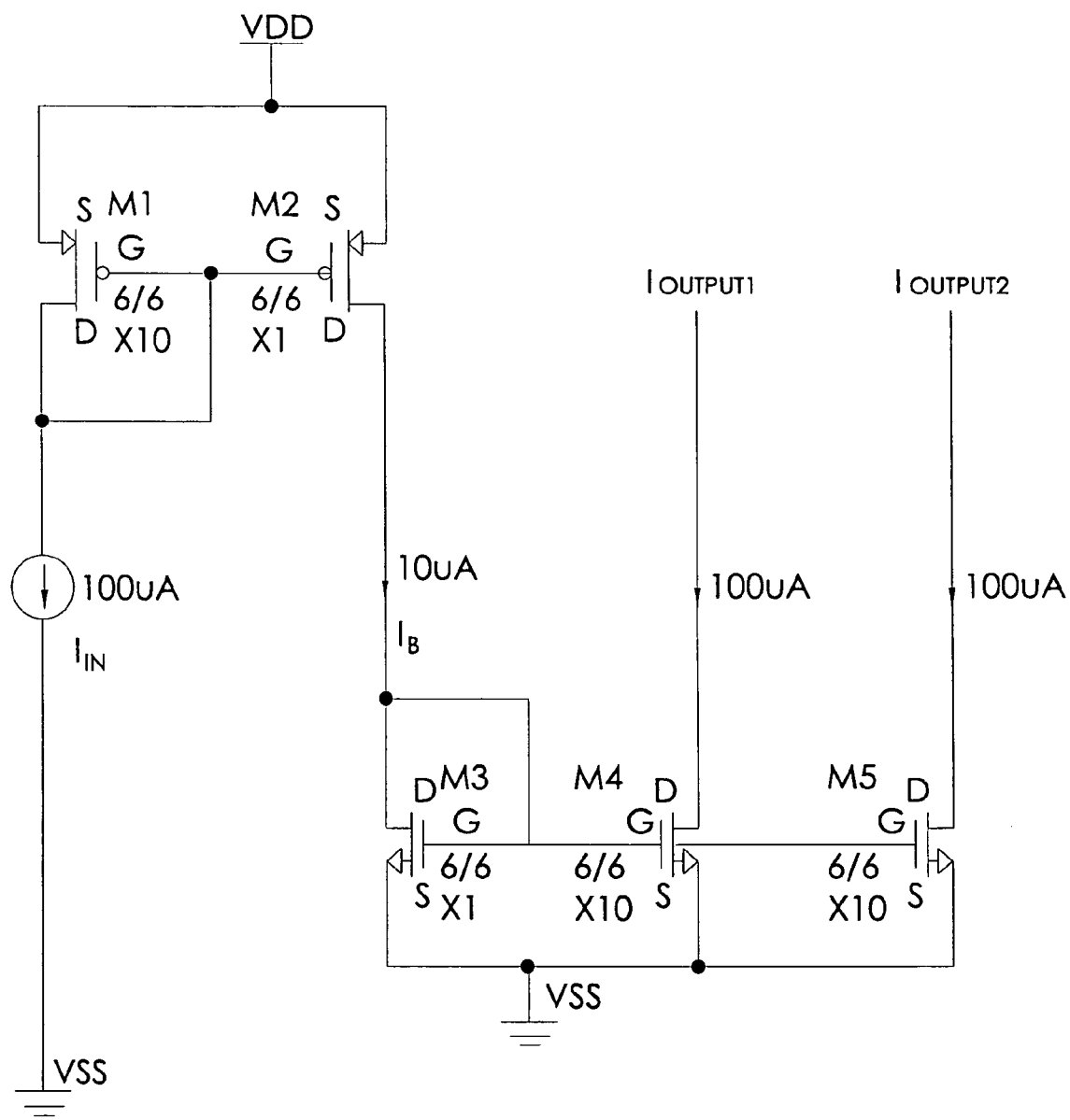
FIG. 15 is a circuit diagram of a conventional current mirror in accordance with the prior art.

Please further referring to FIG. 14, the current mirror circuit is applied to an OLED driving circuit having multi-channel outputs. A first curve designated with diamond symbols and a second curve designate with rectangle symbols respectively represent a relationship between the bias currents ($I_B$) and the output currents ($I_{OUT}$) of a conventional current mirror and the current mirror circuit in accordance with the present invention. The two threshold currents of the current mirror circuit of the second embodiment are shown in two positions, which are respectively positioned on two output currents 65 μA and 130 μA. A third curve designated with triangle symbols and a forth curve designate cross symbols respectively represent another relationship between the current skews and the output currents ($I_{OUT}$) of the conventional current mirror and the current mirror circuit in accordance with the present invention. The current skew of the conventional current mirror is about 4.7% and the current skew of the current mirror circuit is only about 2.8% when the output current is at the minimum level (24 μA).

Based on the forgoing description, when the current mirror circuit in accordance with the present invention applies a stable current source, such as a driving circuit of the OLED or LED product having multi-channel outputs requirement, the current mirror circuit in accordance with the present invention can be applied by using multiple current mirrors connected in serial to meet with this requirement of the driving circuit of the OLED or LED product. Therefore, the skew of the output current and the quality of the power source are substantially improved, and the adjustable range of the output current is increased. Therefore, the driving circuit of the OLED or LED product with the current mirror circuit can be applied to a more extensive operating range to reduce amount of products and production costs and increase more convenient for clients.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. An auto-range current mirror circuit comprising:
   a front stage current mirror having a first adjustable amplifying rate, a current input adapted to connect to an input current and a current output, and generating a bias current in the current output;
   a rear stage current mirror
      having a second adjustable amplifying rate, an input terminal connected to the current output of the front stage current mirror and at least one output terminal, connected to the front stage current mirror in series to have the bias current from the front stage current mirror, and
      amplifying the bias current by the second amplifying rate to generate an output current in the output terminal; and
   at least one current sensing circuit, each electronically connects to the front and rear stage current mirrors and the input current and has a preset threshold current, wherein each current sensing circuit outputs a controlling signal to the front and rear stage current mirrors to adjust a suitable amplifying rate according to the present input current.

2. The current mirror circuit as claimed in claim 1 further comprising multiple current sensing circuits respectively having different preset threshold currents.

3. The current mirror circuit as claimed in claim 1 further comprising at least one middle stage current mirror connected between the front stage and the rear stage current mirrors in series.

4. The current mirror circuit as claimed in claim 3, wherein each middle stage current mirror comprises
   at least one front stage current mirror unit connected to the rear stage current mirror; and
   at least one rear stage current mirror unit connected to the front stage current mirror, and each rear stage current mirror unit provides an output current.

5. The current mirror circuit as claimed in claim 1, wherein the current sensing circuit comprises:
   a voltage converter connected to the current input of the front stage current mirror to convert the input current to a corresponding voltage and having
      an input terminal connected to the current input of the front stage current mirror; and
      an output terminal outputting the corresponding voltage; and
   a voltage comparator having
      a first input connected to output terminal of the voltage converter;
      a second input connected to a reference voltage; and
      an output electronically connected to the front and rear stage current mirrors to generate a voltage by comparing the reference voltage with the converted voltage corresponding to the input current.

6. The current mirror circuit as claimed in claim 1, wherein the current sensing circuit comprises a current comparator having
   two inputs respectively connected to the current input of the front stage current mirror and a reference current; and
   an output electronically connected to the front and rear stage current mirrors to generate a current by comparing the reference current with the input current.

7. The current mirror circuit as claimed in claim 1, wherein the front stage and the rear stage current mirrors respectively comprise
   a basic two-transistor current source connected to the input current and generate the output current;
   at least one additional transistor connected to the basic two-transistor current source in parallel; and
   at least one switch connected between the corresponding additional transistor and the basic two-transistor current mirror to determine whether the corresponding additional transistor electronically connected to the basic two-transistor current source to adjust a amplifying rate of the front and rear stage current mirrors.

8. The current mirror circuit as claimed in claim 1, wherein the front stage current mirror comprises:
   a basic two-transistor current source connected to the input current and generate the output current;
   at least one additional transistor connected to the basic two-transistor current source in parallel and the current input; and
   at least one switch connected between the corresponding additional transistor and the basic two-transistor current mirror to determine whether the corresponding additional transistor electronically connected to the basic two-transistor current source to adjust an amplifying rate of the front stage current mirror.

9. The current mirror circuit as claimed in claim 1, wherein the front stage current mirror comprises
   a basic two-transistor current source connected to the input current and generate the output current;
   at least one additional transistor connected to the basic two-transistor current source in parallel and the current output; and
   at least one switch connected between the corresponding additional transistor and the basic two-transistor current mirror to determine whether the corresponding additional transistor electronically connected to the basic two-transistor current source to adjust an amplifying rate of the front stage current mirror.

10. The current mirror circuit as claimed in claim 1, wherein the front stage current mirror comprises
    a basic two-transistor current source connected to the input current and generate the output current;
    two additional transistor respectively connected to the current input and basic two-transistor current source in parallel, and the current output and the basic two-transistor current source in parallel; and
    two switches, each connects between the corresponding additional transistor and the basic two-transistor current mirror to determine whether the corresponding additional transistor electronically connected to the basic two-transistor current source to adjust an amplifying rate of the front stage current mirror.

11. The current mirror circuit as claimed in claim 1, wherein the rear stage current mirror comprises
    a basic two-transistor current source connected to the input current and generate the at least one output current;
    at least one additional transistor connected to the basic two-transistor current source in parallel and the input terminal; and
    at least one switch connected between the corresponding additional transistor and the basic two-transistor current source to determine whether the corresponding additional transistor electronically connected to the basic two-transistor current source to adjust an amplifying rate of the rear stage current mirror.

12. The current mirror circuit as claimed in claim 1, wherein the rear stage current mirror comprises
   a basic two-transistor current source connected to the input current and generate the at least one output current;
   at least one additional transistor connected to the basic two-transistor current source in parallel and the corresponding output terminal; and
   at least one switch connected between the corresponding additional transistor and the basic two-transistor current mirror to determine whether the corresponding additional transistor electronically connected to the basic two-transistor current source to adjust an amplifying rate of the rear stage current mirror.

13. The current mirror circuit as claimed in claim 1, wherein the rear stage current mirror comprises
   a basic two-transistor current source connected to the input current and generate the at least one output current;
   two additional transistor respectively connected to the input terminal and basic two-transistor current source in parallel, and the output terminal and the basic two-transistor current source in parallel; and
   two switches each connects between the corresponding additional transistor and the basic two-transistor current mirror to determine whether the corresponding additional transistor electronically connected to the basic two-transistor current source to adjust an amplifying rate of the rear stage current mirror.

14. The current mirror circuit as claimed in claim 7, each additional transistor is MOS transistor having a drain terminal, source terminal and a gate terminal.

15. The current mirror circuit as claimed in claim 14, each switch is connected to the drain terminal.

16. The current mirror circuit as claimed in claim 14, each switch is connected to the drain terminal, the source terminal and the gate terminal.

* * * * *